(12) United States Patent
von Arx

(10) Patent No.: US 9,153,677 B2
(45) Date of Patent: Oct. 6, 2015

(54) INSULATED GATE BIPOLAR TRANSISTOR WITH HIGH EMITTER GATE CAPACITANCE

(71) Applicant: ABB Schweiz AG, Baden (CH)

(72) Inventor: Christoph von Arx, Olten (CH)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 14/514,893

(22) Filed: Oct. 15, 2014

(65) Prior Publication Data

US 2015/0028382 A1 Jan. 29, 2015

Related U.S. Application Data

(63) Continuation of application No. PCT/EP2013/058649, filed on Apr. 25, 2013.

(30) Foreign Application Priority Data

Apr. 25, 2012 (EP) .................................. 12165480

(51) Int. Cl.
*H01L 29/66* (2006.01)
*H01L 29/739* (2006.01)
(Continued)

(52) U.S. Cl.
CPC ........ *H01L 29/7396* (2013.01); *H01L 29/0615* (2013.01); *H01L 29/0804* (2013.01); *H01L 29/404* (2013.01); *H01L 29/408* (2013.01);
(Continued)

(58) Field of Classification Search
CPC .............. H01L 29/0615; H01L 29/408; H01L 29/41775; H01L 29/4916; H01L 29/404; H01L 29/7396; H01L 29/0804; H01L 29/435
See application file for complete search history.

(56) References Cited

U.S. PATENT DOCUMENTS 4,489,103 A 12/1984 Goodman et al.
5,449,938 A 9/1995 Stockmeier et al.
(Continued)

FOREIGN PATENT DOCUMENTS

EP 0 616 365 A1 9/1994

OTHER PUBLICATIONS

International Search Report (PCT/ISA/210) mailed on Jul. 22, 2013, by the European Patent Office as the International Searching Authority for International Application No. PCT/EP2013/058649.
(Continued)

*Primary Examiner* — Khiem D Nguyen
(74) *Attorney, Agent, or Firm* — Buchanan Ingersoll & Rooney PC

(57) ABSTRACT

An IGBT is disclosed with a high emitter-gate capacitance, wherein an active cell region can include plural emitter and gate regions. A termination edge region can include a varied lateral doping region VLD. Each gate polysilicon layer can be arranged at a surface of the semiconductor substrate in the gate regions, separated from the semiconductor substrate by a first insulating layer. A first SIPOS layer and a covering second insulating layer overlie at least portions of the gate polysilicon layer. In a central area, the gate polysilicon layer is in electrical contact with the overlying first SIPOS layer whereas, in a peripheral area, the gate polysilicon layer is electrically separated from the overlying first SIPOS layer. A substrate surface at the VLD region is in electrical contact with a second SIPOS layer, and an increased gate-emitter capacitance may be achieved by slightly modifying etch masks during manufacturing.

20 Claims, 3 Drawing Sheets

(51) Int. Cl.
*H01L 29/40* (2006.01)
*H01L 29/417* (2006.01)
*H01L 29/43* (2006.01)
*H01L 29/06* (2006.01)
*H01L 29/08* (2006.01)
*H01L 29/49* (2006.01)

(52) U.S. Cl.
CPC ........ *H01L 29/41775* (2013.01); *H01L 29/435* (2013.01); *H01L 29/4916* (2013.01)

(56) References Cited

U.S. PATENT DOCUMENTS

| | | | |
|---|---|---|---|
| 6,054,748 A | 4/2000 | Tsukuda et al. | |
| 6,750,508 B2 * | 6/2004 | Omura et al. | 257/329 |
| 2007/0138542 A1 * | 6/2007 | Schmidt | 257/328 |
| 2010/0052047 A1 * | 3/2010 | Schmidt | 257/330 |
| 2011/0233714 A1 | 9/2011 | Lu | |

OTHER PUBLICATIONS

European Search Report (EPO Form 1507N) mailed on Oct. 10, 2012.

Notification Concerning Transmittal of International Preliminary Report on Patentability (Forms PCT/IB/326 and PCT/IB/373) and the Written Opinion of the International Searching Authority (Form PCT/ISA/237) issued on Nov. 6, 2014, by the International Bureau of WIPO in corresponding International Application No. PCT/EP2013/058649. (6 pages).

* cited by examiner

INSULATED GATE BIPOLAR TRANSISTOR WITH HIGH EMITTER GATE CAPACITANCE

RELATED APPLICATION(S)

This application claims priority as a continuation application under 35 U.S.C. §120 to PCT/EP2013/058649, which was filed as an International application on Apr. 25, 2013, designating the U.S., and which claims priority to European Application No. 12165480.0 filed in Europe on Apr. 25, 2012. The entire contents of these applications are hereby incorporated by reference in their entireties.

FIELD

The present disclosure relates to the field of semiconductor power devices, such as the field of insulated gate bipolar transistors.

BACKGROUND INFORMATION

An insulated gate bipolar transistor (IGBT) is a power semiconductor device which may be used as an electronic switch. The IGBT is a three-terminal device having an emitter, a collector and a gate. As IGBTs may combine high efficiency with fast switching, they are frequently used in modern appliances such as electric cars, trains, etc., in order to rapidly turn on and off electric power.

A controllability of an IGBT can strongly depend on capacitances occurring within the IGBT such as a gate-emitter capacitance, a collector-emitter capacitance, and a gate-collector capacitance which is also referred to as Miller capacitance. For high controllability, it may be desirable to have a high gate-emitter capacitance with respect to the Miller capacitance.

SUMMARY

An insulated gate bipolar transistor is disclosed comprising a semiconductor substrate including an active cell region and a termination edge region, wherein the active cell region includes a plurality of emitter regions and gate regions arranged between neighboring emitter regions, each gate region having a gate polysilicon layer and a first insulating layer, wherein each gate polysilicon layer is arranged at a surface of the semiconductor substrate in the gate regions and is separated from the semiconductor substrate by the first insulating layer; a first SIPOS layer covered by a second insulating layer, wherein the first SIPOS layer and the covering second insulating layer overlie at least portions of the gate polysilicon layer, the first SIPOS layer being thereby separated from the semiconductor substrate; an intermediate third insulating layer, wherein each gate region includes a central area and a peripheral area, and wherein, in the central area, the gate polysilicon layer is in electrical contact with the overlying first SIPOS layer whereas, in the peripheral area, the gate polysilicon layer is electrically separated from the overlying first SIPOS layer by an intermediate third insulating layer; and an emitter metal layer which overlies the plurality of emitter regions and the gate regions and, at the emitter regions, is in direct contact with the surface of the semiconductor substrate and, at the gate regions, is in direct contact with the second insulating layer.

BRIEF DESCRIPTION OF THE DRAWINGS

Exemplary embodiments will be explained in more detail in the following text with reference to the attached drawings, wherein.

Figure 1:
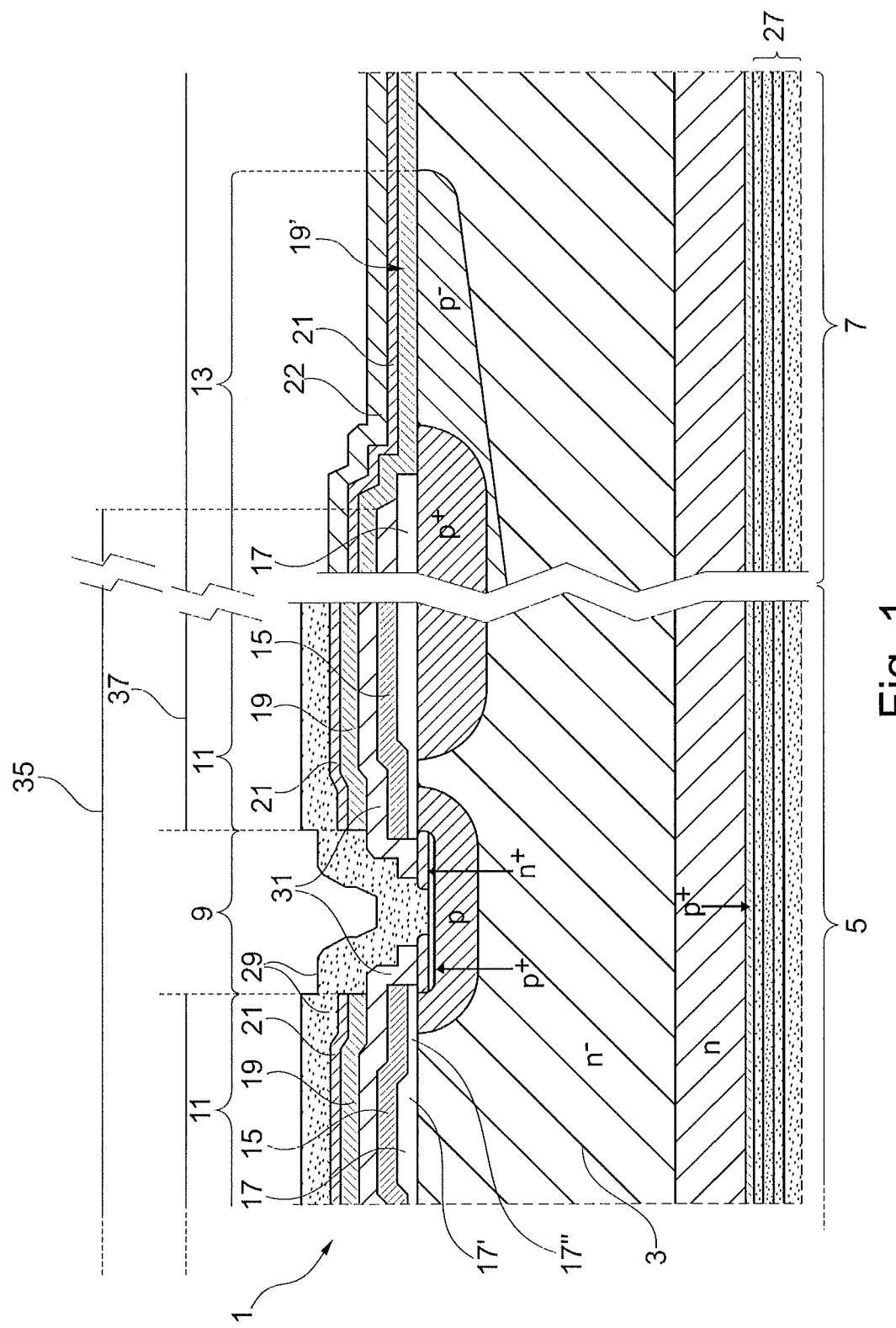
FIG. 1 shows a partial cross section visualizing a layer structure of an exemplary known IGBT.

The drawings are schematics and are not to scale. The described embodiments are meant as examples and do not limit the invention. The same reference symbols indicate the same elements or corresponding features throughout the figures. The reference symbols used in the figure and their meanings are summarized in the list of reference symbols.

DETAILED DESCRIPTION

Exemplary embodiments as disclosed herein can include an insulated gate bipolar transistor having a high gate-emitter capacitance with respect to the Miller capacitance. For example, an IGBT having such high gate-emitter capacitance can be manufactured using a relatively simple manufacturing process.

According to an exemplary aspect disclosed herein, an insulated gate bipolar transistor (IGBT) with a specific arrangement of conducting layers, semiconducting layers, insulating layers and semi-insulating layers is proposed. The proposed IGBT can include a semiconductor substrate having an active cell region and a termination edge region. The active cell region can include a plurality of emitter regions and gate regions arranged between neighboring emitter regions. The termination edge region can include a varied lateral doping region. A gate polysilicon layer is arranged in the gate regions at the surface of the semiconductor substrate and is separated from the semiconductor substrate by a first insulating layer. A surface of the semiconductor substrate at the varied lateral doping region is in electrical contact with a second SIPOS (Semi-Insulating Polycrystalline Silicon) layer, the second SIPOS layer being covered by a second insulating layer.

The gate region can include a central area and a peripheral area laterally surrounding the central area. Laterally shall define the position of two layers/area to each other in a plane parallel to the surface of the semiconductor substrate. In an exemplary central area, the gate polysilicon layer is in electrical contact with an overlying first SIPOS layer whereas, in the peripheral area, the gate polysilicon layer is electrically separated from the overlying first SIPOS layer by an intermediate third insulating layer. The first SIPOS layer 19 can be covered by the second insulating layer.

SIPOS (semi-insulating polycrystalline silicon) is effectively oxygen-doped polycrystalline silicon. It can be made by a Low Pressure Chemical Vapor Deposition (LPCVD) process using silane (SiH4) with nitrous oxide (N2O) for the deposition of high resistivity polysilicon layers (e.g., at temperatures of 600 to 700° C.). Such processes are e.g. described in "Structure of semi-insulating polycrystalline silicon (SIPOS)" by Prasad, Master Thesis, Department of electrical and computer engineering, 1986 and U.S. Pat. No. 4,489,103, the content of these documents including the definition for the SIPOS layer from both documents, being incorporated herein by reference in their entireties.

An emitter metal layer can overlie at least the emitter region and optionally the gate region. At the emitter region, the emitter metal layer can be in direct contact with the semiconductor surface (p base layer and n source region) whereas, at the gate region, the emitter metal layer can be in direct contact with the second insulating layer and is, thus, insulated from the semiconductor substrate and the gate polysilicon layer.

Exemplary embodiments can include a novel layer structure for an IGBT which can significantly increase the gate emitter capacitance of the IGBT wherein the novel layer structure may be achieved by slightly modifying a known processing sequence for manufacturing an IGBT.

In some known IGBTs, a SIPOS layer covers large portions of the IGBT. The SIPOS layer has been used to prevent electrical overstresses at a termination edge region being provided with a varied lateral doping structure. For this purpose, the second SIPOS layer can be in direct electrical contact with the surface of the semiconductor in the termination edge region.

The first and second SIPOS layers can be covered with a thin dielectric layer which is referred to herein as second insulating layer. While, in known designs, the SIPOS layer may also overlie the gate regions within the active cell region of the IGBT, the SIPOS layer in the gate region is neither in electrical contact with the surface of the semiconductor nor with a gate polysilicon layer overlying the gate region. Instead, in known configurations, the gate polysilicon is electrically separated from the surface of the semiconductor by a first insulating layer. Furthermore, in known configurations, the SIPOS layer is electrically separated from the gate polysilicon layer by a third insulating layer.

While, in known IGBT designs, the SIPOS layer in the gate regions may serve for mechanically protecting underlying layer structures for example during device processing, it appeared to have no significant electrical effect to operating characteristics of the IGBT.

However, it has now been found that by bringing part of the first SIPOS layer in electrical contact with the underlying gate polysilicon layer, the gate-emitter capacitance of the IGBT can be significantly increased. Being in electrical contact with the gate polysilicon layer, the first SIPOS layer is set to a same electrical potential as the gate polysilicon layer. In such a configuration, the gate polysilicon layer is for example electrically separated from the overlying emitter metal layer only by the thin second insulating layer covering the first SIPOS layer. As this second insulating layer is thin, a capacitance between the gate polysilicon layer and the emitter metal layer becomes large. Such large gate-emitter capacitance may be beneficial for the IGBT and can, for example, improve the controllability of the IGBT.

The second insulating layer may have an exemplary thickness of between 0.05 µm and 0.3 µm. Such thickness has been found to provide for a sufficient electrical insulation between the SIPOS layers and the emitter metal layer, on the one hand, and to allow high capacitance between these layers, on the other hand.

The second insulating layer may include a silicon nitride layer deposited by LPCVD (Low Pressure Chemical Vapor Deposition). Such second insulating layer has been found to provide for high quality insulation and passivation for the SIPOS layer.

The third insulating layer may have an exemplary thickness of between 0.2 µm and 1.5 µm. Such thickness has been found to provide for a sufficient electrical insulation between the peripheral region of the first SIPOS layer and the underlying gate polysilicon layer.

The third insulating layer may include a phosphorous silica glass, also referred to as PSG. Such third insulating layer has been found to provide for high quality insulation and may be easily deposited using for example PECVD (Plasma Enhanced Chemical Vapor Deposition).

Each gate region can include a central area and a peripheral area. The central area in which the gate polysilicon layer is in electrical contact with the overlying first SIPOS layer may be larger than the peripheral area in which the gate polysilicon layer is electrically separated from the overlying first SIPOS layer by the intermediate third insulating layer. Due to such large area contact between the central region of the gate polysilicon and the first SIPOS layer, high emitter-gate capacitance may be achieved for the IGBT.

The peripheral area in which the gate polysilicon layer is electrically separated from the overlying first SIPOS layer by the intermediate third insulating layer may have an exemplary being smaller than 1 µm. Such a small peripheral area may allow for a maximum surface of the central area in which the gate polysilicon layer is not electrically separated from the overlying first SIPOS layer by the intermediate third insulating layer, thereby enabling maximum gate-emitter capacitance.

Aspects and embodiments of the present disclosure are described herein with reference to different subject-matters. Those skilled in the art will gather from the above and the following description that, unless other notified, in addition to any combination of features belonging to one type of subject-matter, also any combination between features relating to different subject-matters is considered to be encompassed herein.

FIG. 1 schematically shows a partial cross-section of an exemplary known IGBT 1. The IGBT 1 is based on a semiconductor substrate 3 such as a silicon wafer. The semiconductor substrate 3 includes an active cell region 5 arranged in a center of the semiconductor substrate 3 and a termination edge region 7 arranged at a circumferential periphery of the semiconductor substrate 3. The substrate includes an emitter side and a collector side opposite to the emitter side, and the active cell region 5 includes layers from the emitter side to the collector side. It is arranged in the center of the substrate. The termination edge region 7 laterally surrounds the active cell region 5.

The active cell region 5 includes a plurality of emitter regions 9 and gate regions 11 arranged between neighboring emitter regions 9. In the figures, only one emitter region 9 is shown. However, the IGBT can include a multiplicity of emitter regions 9 arranged, for example, at periodic distances at the left-hand side in the figures, wherein each of the emitter regions is for example laterally separated from a neighboring emitter region by an intermediate gate region 11. The emitter region 9 shown in the Figures is the outer most emitter region 9 in the active cell region 5. The active cell region 5 can include the emitter and gate regions 9, 11 and that part of the substrate to the collector side, which lies in projection to these regions 9, 11 (e.g., the central part of the $n^-$-type base and the p-doped collector layer arranged between the $n^-$-type base and the collector metal layer 29).

Towards a periphery of the semiconductor substrate 3 (e.g., towards a right-hand side in the figures) the active cell region 5 is delimited towards a circumferential edge of the semiconductor substrate 3 by an adjacent circumferential peripheral termination edge region 7.

The rear side surface of the semiconductor substrate 3 is covered with a collector metal layer (e.g., formed as a collector metal layer stack 27 containing the aluminium layer, a titanium layer, a nickel layer, and a silver layer).

At the emitter region 9, the semiconductor substrate 3 includes a layer structure with a deep p-type base layer, optionally a shallow $p^+$-type contact layer, and an even shallower $n^+$-type source region, all of which are incorporated into the $n^-$-type base of the semiconductor substrate 3 on the emitter side. At the emitter region 9, the surface of the semiconductor substrate 3 is locally contacted by an electrically conductive layer (e.g., in form of an emitter metal layer 29. The source region and the p base layer (or the p+ contact layer, through which the contact to the p base layer can be made) contact the emitter metal layer 29.

Figure 2:
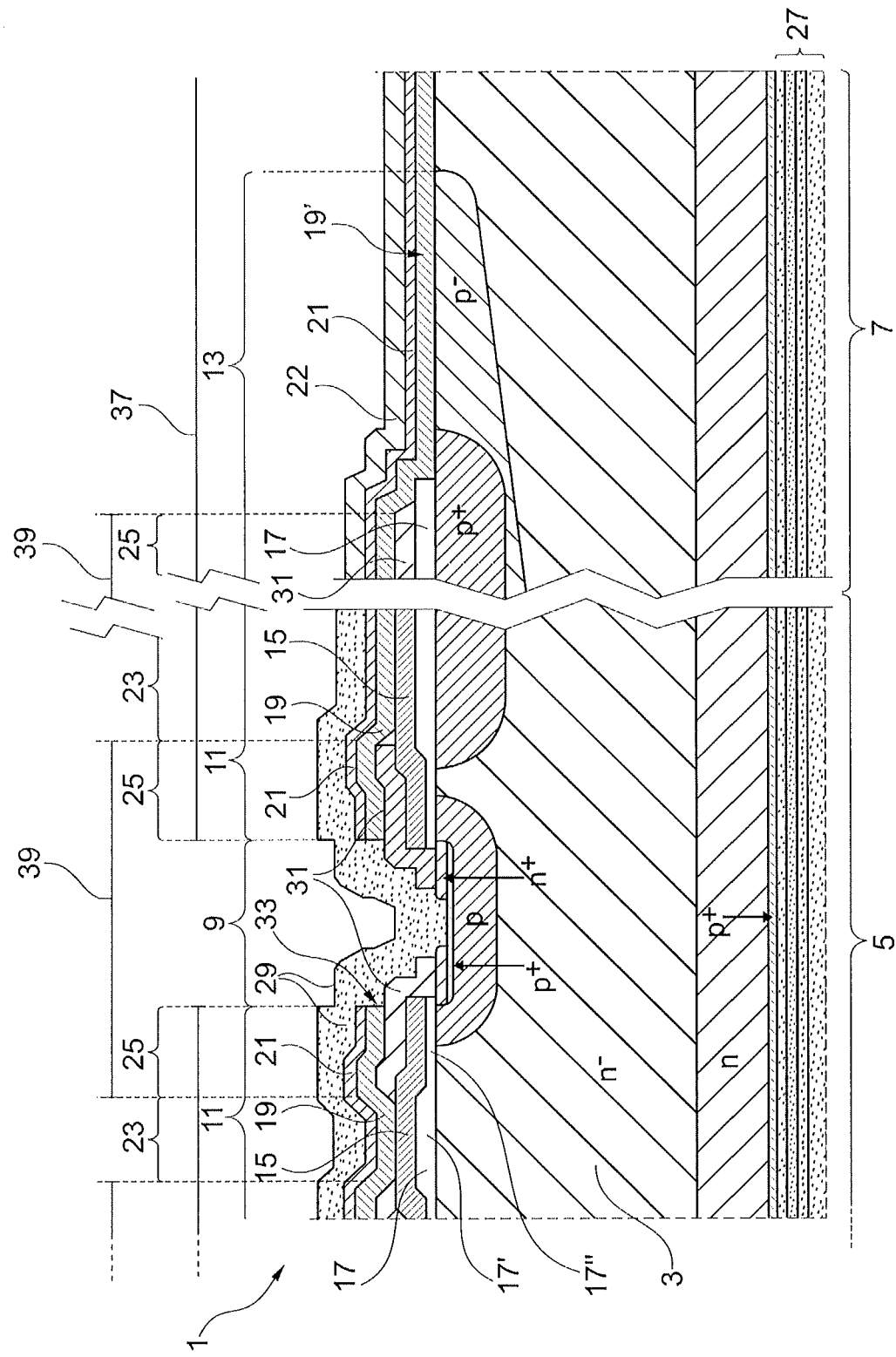
FIG. 2 shows a partial cross section visualizing a layer structure of an IGBT according to an exemplary embodiment disclosed herein.

At the gate regions 11, the surface of the semiconductor substrate 3 is covered with a gate polysilicon layer 15 which is separated from the emitter sided surface of the semiconductor substrate 3 by a first insulating layer 17. By such an arrangement, the gate polysilicon layer 15 forms a planar gate electrode (as shown in FIG. 2). The first insulating layer 17 may include a thin gate oxide 17" at its periphery neighboring to the emitter regions 9, this gate oxide having a thickness on the order of 100 nanometers. In a center region, surrounded by the periphery neighboring to the emitter regions 9, the first insulating layer 17 may include a thicker field oxide 17' having a thickness on the order of 1 micrometer. Both, the gate oxide and the field oxide may be thermally grown silicon oxides ($SiO_2$). The first insulating layer 17 electrically insulates the covering gate polysilicon layer 15 from the surface of the semiconductor substrate 3. The gate polysilicon layer may be made from a LPCVD process with $SiH_4$ and may have a thickness of 0.2 μm to 2 μm. The gate polysilicon layer may be doped to have a reduced resistivity.

The surface is the emitter sided surface of the substrate and the plane to which the substrate extends on the emitter side.

Alternatively to an exemplary IGBT disclosed herein with a planar gate electrode, an exemplary IGBT as disclosed herein may include a gate polysilicon layer 15 formed as trench gate electrode. The trench gate electrode is arranged in the same plane as the p-type base layer and adjacent to the source regions, separated from the p base layer and the source region by the first insulating layer 17, which also separates the trench gate electrode from the $n^-$-type base. The trench gate region is arranged at the surface of the semiconductor substrate 3 (e.g., the trench gate electrodes are arranged in the gate regions in recesses of the substrate so that the recesses are first coated with a first insulating layer and then filled with a polysilicon layer, which extends in the recess up to the surface of the substrate).

A third insulating layer 31 is arranged on top of the trench gate region, thus insulating the trench gate electrode from the emitter metal layer 29. For a trench gate electrode, the gate polysilicon layer 15 may further extend to a region on the surface of the semiconductor substrate laterally to the recess (similar to a planar gate electrode as shown in FIG. 2), in which the trench gate electrode is arranged, and parallel to an emitter side of the semiconductor substrate similar to a planar polysilicon layer. Also in this planar region, which is in contact to the trench region, the gate polysilicon layer 15 is electrically insulated from the semiconductor substrate 3 by the first insulating layer 17. By having the trench gate electrode extending to an area on the substrate surface beyond (e.g., laterally to the recess for the trench gate electrode), it is possible to enlarge the contact area between the SIPOS layer 19 and the gate polysilicon layer 15 as for a planar gate electrode.

A known gate polysilicon layer 15 is electrically isolated from an overlying emitter metal layer 29 by an intermediate third insulation layer 31. The third insulation layer 31 may be made with phosphorous silica glass (PSG). Such PSG layer 31 may be deposited over the entire emitter sided surface of the semiconductor substrate 3 and the portions of the first insulating layer 17 and the gate polysilicon layer 15 previously deposited thereon. For example, the third insulating layer 31 may be deposited using plasma enhanced chemical vapor deposition (PECVD) and may have a thickness of 0.2 μm to 2 μm. While the third insulating layer 31 initially covers the entire emitter sided substrate surface, it may be removed in subsequent etching steps, for example at locations, where the emitter metal layer 29 shall contact the surface of the semiconductor substrate 3 in the emitter regions 9.

The peripheral area is arranged between the central area and the area, in which the emitter metal layer contacts the semiconductor substrate 3. The peripheral area 25 in which the gate polysilicon layer 15 is electrically separated from the overlying first SIPOS layer 19 by the intermediate second insulating layer 21 may have a width being smaller than 1 μm. Width is measured in a plane parallel to the surface of the substrate 3 and shall is the distance between the central area 23 and the emitter metal layer 29 and across the peripheral area; i.e., the smallest distance from any point at the interface between the central and peripheral area 23, 25 (i.e., on the border of the peripheral area 25 towards the central area 23 to a point on the interface between the peripheral area and the emitter metal layer 25, 29) (i.e., on the border of the peripheral area 25 towards the emitter metal layer 29)). The border is the lateral limit of the peripheral area 25 in the plane parallel to the surface of the substrate 3. In this embodiment, the width of the peripheral area is smaller than 1 μm.

At the termination edge region 7, a varied lateral doping region 13 is formed for example at the emitter sided surface of the semiconductor substrate 3 as follows. In a partial region towards the centre of the semiconductor substrate 3 (i.e., towards the active cell region 5), a heavily doped $p^+$-type region is formed. Towards an outer peripheral edge of the semiconductor substrate 3, a lightly doped $p^-$-type region is formed wherein the doping concentration and/or the depth of this $p^-$-type region diminishes towards the peripheral edge of the semiconductor substrate 3. Such varied lateral doping region 13 may help to prevent electrical overstress at the periphery of the IGBT.

At the varied lateral doping region 13, a $p^-$-$n^-$-junction as well as a $p^+$-$p^-$-junction reaches the surface of the semiconductor substrate 3. A partial region of the termination edge region 7 for example at such locations of exposed junctions is completely freed from any layers previously deposited on top of the surface of the semiconductor substrate 3 and a second SIPOS layer 19' is deposited directly on top of the surface of the semiconductor substrate 3. It is in direct contact to the VLD region 13 and the $n^-$ type base. Accordingly, the second SIPOS layer 19' is in electrical contact with the semiconductor substrate surface and may prevent any local electrical overstress at the termination edge region 7.

The second SIPOS layer 19' may be made with $SiH_4$ and $N_2O$ and may have an exemplary thickness on the order of 0.2 μm to 1 μm. The second SIPOS layer 19' is separated from the first SIPOS layer 19; i.e. the SIPOS layers 19, 19' are not in contact to each other. Additionally, the second SIPOS layer 19' may include a region adjacent to the active cell region 5 (i.e. between the central area and the area), in which the second SIPOS layer 19' contacts the semiconductor substrate 3, in which the second SIPOS layer 19' is not in contact to the semiconductor substrate 3, but separated from it by the first insulating layer 17. Additionally, the third insulating layer 31 may also be arranged between the second SIPOS layer 19' and the semiconductor substrate 3.

The device may also have any other appropriate termination design known to those skilled in the art. An exemplary device disclosed herein can include any known termination layers, optionally combined with a second SIPOS layer 19'.

The SIPOS layers 19, 19' are covered by a thin second insulating layer 21. For example, this second insulating layer 21 may be made with silicon nitride deposited using low pressure chemical vapor deposition (LPCVD) with an exemplary thickness of between 0.05 μm and 0.3 μm. At the termination edge region 7, the second insulating layer 21 may be covered with additional passivation layers 22. The thicknesses of this second insulating layer 21 and of other layers like the third insulating layer 31 are measured in a plane perpendicular to the surface of the substrate 3 and in an area, in which the layer is arranged parallel to the surface of the substrate 3; i.e., in which the layer has a constant thickness and not in an area, in which a layer changes its distance to the surface of the substrate 3.

In known design of an IGBT shown in FIG. 1, the first SIPOS layer 19 and the covering second insulating layer 21 are not only provided at the termination edge region 7 but also extend into the active cell region 5 where they cover the third insulating layer 31 at the gate regions 11. While, in the termination edge region 7, the second SIPOS layer 19' and second insulating layer 21 serve for electrical purposes for preventing local electrical overstress, in the gate regions 11 of the active cell region 5 they serve for mechanically protecting underlying layer structures (e.g., during subsequent processing steps).

Figure 3:
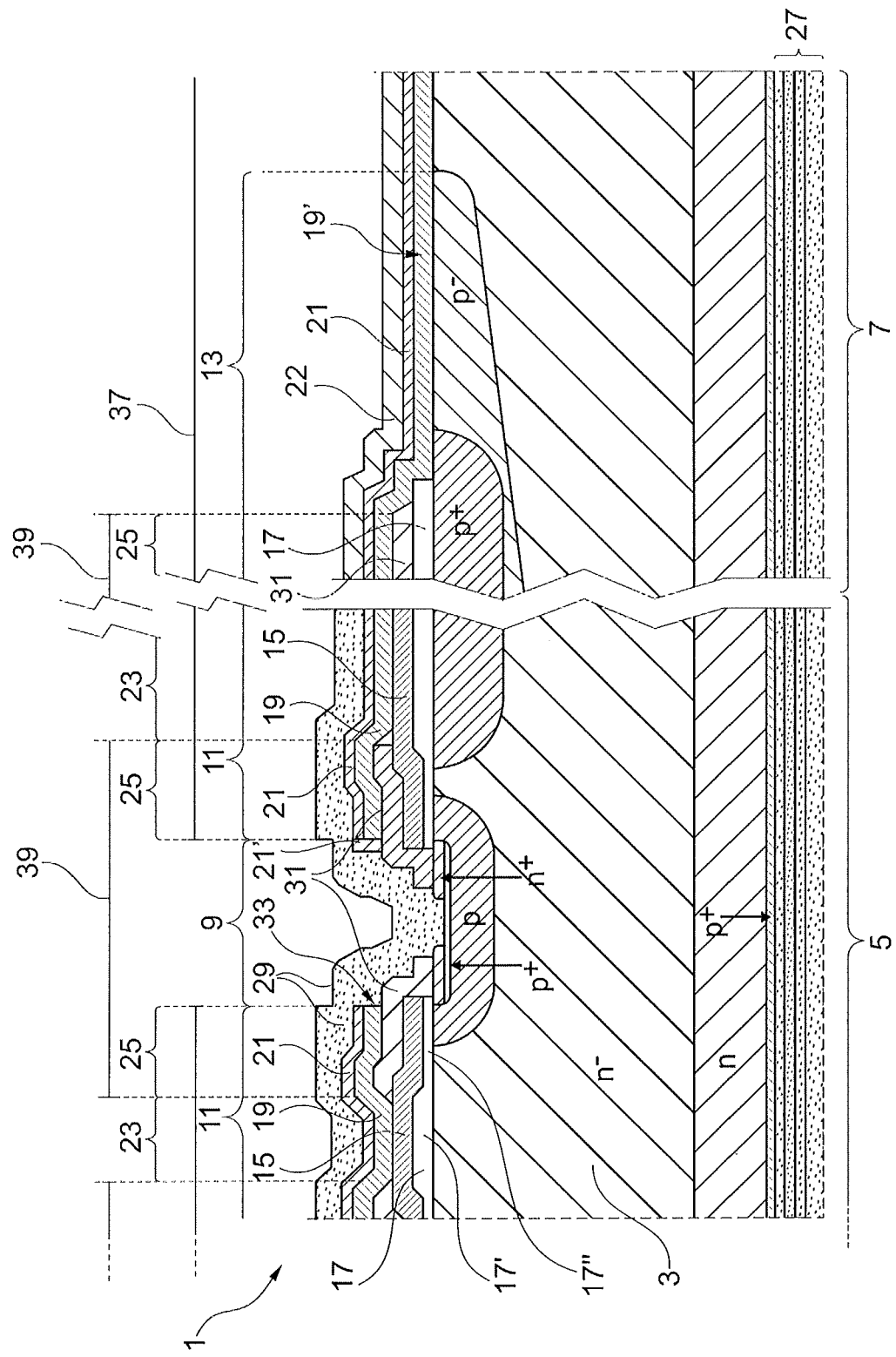
FIG. 3 shows a partial cross section visualizing a layer structure of an IGBT according to exemplary embodiment disclosed herein.

While the general structure of an exemplary conventional IGBT has been explained with reference to FIG. 1, differentiating features of an exemplary embodiment of an IGBT according to the present disclosure shall be described with reference to FIGS. 2 and 3.

An exemplary differentiating feature of exemplary embodiments disclosed herein relates to the specific arrangement of the first SIPOS layer 19 and the covering second insulating layer 21 with respect to the gate polysilicon layer 15 in the gate region 11. While in the known design of FIG. 1, the first SIPOS layer 19 is completely separated from and electrically isolated against the gate polysilicon layer 15 by the intermediate third insulating layer 31, in an exemplary design of an IGBT as shown in FIG. 2, such third insulating layer 31 is locally removed such that the first SIPOS layer 19 is in electrical contact with the gate polysilicon layer 15 in a central area 23. For example, only in a peripheral area 25 adjacent to the central area 23 and completely laterally surrounded by it, the first SIPOS layer 19 is separated from the gate polycrystalline layer 15 by a remainder of the third insulating layer 31. The central area 23 and the peripheral area 25 are arranged in the active cell region 5 in a plane parallel to the emitter side and the peripheral area 25 laterally completely surrounds the central area 23.

As the first SIPOS layer 19 is in electrical contact with the gate polysilicon layer 15, both layers 15, 19 are on a same electrical potential during operation of the IGBT. An electrical isolation between the gate polysilicon layer 15 and the emitter metal layer 29 is then, for example, only provided by the intermediate thin second insulating layer 21.

Each gate region can include a central area and a peripheral area. The central area in which the gate polysilicon layer is in electrical contact with the overlying first SIPOS layer may be larger than the peripheral area in which the gate polysilicon layer is electrically separated from the overlying first SIPOS layer by the intermediate third insulating layer.

The emitter metal layer 29 has an emitter metal area in a plane parallel the emitter side of the semiconductor substrate 3. first SIPOS layer 19 may be in contact to the gate polysilicon layer 15 in a contact area, which is, for example, at least 50%, for example, at least 60% and in particular, for example, at least 65% of the emitter metal area. The emitter metal area is meant as the area in a plane parallel to the emitter side, to which the emitter metal layer projected on that plane extends.

The contact area from the polysilicon layer 15 to the first SIPOS layer 19 is also meant as the area, in which the contact is available, projected on a plane parallel to the emitter side.

Accordingly, while in known design of FIG. 1, a capacitance between the gate polysilicon layer 15 and the emitter metal layer 29 is determined by the sum of the intermediate third insulating layer 31, the intermediate first SIPOS layer 19 and the intermediate second insulating layer 21, with an exemplary design according to an exemplary embodiment disclosed herein as shown in FIG. 2, only the thin second insulating layer 21 determines the capacitance between the gate polycrystalline layer 15 and the emitter metal layer 29 in the central area 23. Accordingly, the overall emitter-gate capacitance of the IGBT may be significantly increased thereby improving the controllability of the IGBT.

In another exemplary embodiment disclosed, the conductivity types of the layers are switched; e.g., all layers of the first conductivity type are p type (e.g. the source region, base, VLD region) and all layers of the second conductivity type are n type (e.g. deep and shallow base layer).

In the following, exemplary differences in processing sequences used for manufacturing a known IGBT and an IGBT according to an exemplary embodiment shall be discussed. While manufacturing an IGBT includes a multiplicity of processing steps, processing steps which differ between manufacturing a known IGBT and manufacturing an IGBT according to an exemplary embodiment disclosed herein shall be discussed in detail.

For manufacturing an IGBT with a known design as shown in FIG. 1, a multiplicity of p-type regions, p$^+$-type regions, n$^+$-type regions, and p$^-$-type regions are formed within the top surface of the semiconductor substrate 3 and various layers including the first insulating layer 17, the gate polysilicon layer 15, and the third insulating layer 31 are formed at the emitter side on top of the surface of a semiconductor substrate 3. For example, all such layers are initially deposited on top of the entire substrate surface and are then locally removed in subsequent steps using, for example, photolithography with specifically adapted etching masks, which locally protect the layers during subsequent etching steps.

For example, as the second SIPOS layer 19' can directly mechanically and electrically contact the surface of the substrate 3 in the varied lateral doping region 13, an etching mask 35 may be used which covers the entire substrate surface except for partial areas of the termination edge region 7 containing the varied lateral doping region 13. After the varied lateral doping region 13 has been exposed in an etching step, the SIPOS layer and the second insulating layer 21 can be deposited over the entire surface of the semiconductor substrate 3 including the first and third insulating layers 17, 31 and the gate polysilicon layers 15 partially covering the active cell region 5.

In order to expose the emitter regions 9, an additional etching mask 37 may be used for locally removing the SIPOS layer and the second insulating layer 21 at the emitter regions 9 in the active cell region 5 and to separate the second SIPOS layer 19' in the termination area from the first SIPOS layer 19 in the active cell region 5.

For obtaining the modified design of an IGBT according to an exemplary embodiment disclosed herein as shown in FIG. 2, the etching procedure for locally removing the third insulating layer 31 is only slightly modified. Instead of using the etch mask 35 shown in FIG. 1, a slightly modified etch mask 39 as shown in FIG. 2 can be used. Such etch mask 39 does not only render the part of the termination edge region 7 including the varied lateral doping region 13 uncovered but also reveals the central areas 23 of the gate polysilicon layers 15. Accordingly, in a subsequent etching step, the third insulating layer 31 can be locally removed in such central area 23 such that, when subsequently depositing the SIPOS layer and the second insulating layer 21, the first SIPOS layer 19 comes in direct mechanical and electrical contact with the underlying gate polysilicon layer 15 at the central area 23.

Briefly summarized in a different wording, a design-wise modification of a so-called VISSAP mask removes the PSG of the third insulating layer 31 on the gate polysilicon layer 15 on a large scale area without any additional process cost. The first SIPOS layer 19 can connect to the gate polysilicon layer 15 and have the same electrical potential. The nitride layer of the second insulating layer 21 can assure the electrical isolation of the gate polysilicon layer 15 and the first SIPOS layer 19 versus the emitter metal layer 29. In this way, a large area with a thin dielectric may increase the gate-emitter capacitance.

It is only briefly noted that in a novel design of an IGBT as proposed herein, there might be a risk of parasitic electrical currents occurring between the emitter metal layer 29 and the gate polysilicon layer 15 as the emitter metal layer 29 may be in electrical contact with the first SIPOS layer 19 at its circumferential sidewall 33. The sidewall 33 is the surface area of the first SIPOS layer 19 perpendicular to the substrate surface/emitter side on the edge of the first SIPOS layer 19. However, any negative impact from such high-ohmic connection from the emitter metal layer 29 via the sidewall 33 of the first SIPOS layer 19 to the gate polysilicon layer 15 may be minimized by suitably adapting the design of the respective layers. Furthermore, a design work around might be possible cutting the emitter metal layer 29 in an active area in a way to let the SIPOS layer sidewall 33 to be sealed by an insulating layer 21' such as for example a silicon nitride layer as shown in FIG. 3.

Another option may be to introduce a process step which creates an oxide layer on sidewall 33. Thus, in FIG. 3, the first SIPOS layer 19 is electrically insulated from the emitter metal layer 29 by the insulating layer 21, 21'. For all exemplary designs disclosed herein, there may be no large-area contact of the first SIPOS layer 19 to the emitter metal layer 29 (e.g., larger than a contact at the circumferential sidewall 33 of the first SIPOS layer 19).

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1: IGBT
3: semiconductor substrate
5: active cell region
7: termination edge region
9: emitter region
11: gate region
13: varied lateral doping region
15: gate polysilicon layer
17: first insulating layer
19: first SIPOS layer
19': second SIPOS layer
21, 21': second insulating layer
23: central area
25: peripheral area
27: collector metal layer stack
29: emitter metal layer
31: third insulating layer
33: side-wall of SIPOS layer
35: etch mask for insulating layer definition
37: etch mask for SIPOS layer definition
39: modified etch mask for insulating layer definition

What is claimed is:

1. An insulated gate bipolar transistor comprising:
a semiconductor substrate including an active cell region and a termination edge region, wherein the active cell region includes a plurality of emitter regions and gate regions arranged between neighboring emitter regions, each gate region having a gate polysilicon layer and a first insulating layer, wherein each gate polysilicon layer is arranged at a surface of the semiconductor substrate in the gate regions and is separated from the semiconductor substrate by the first insulating layer;
a first SIPOS layer covered by a second insulating layer, wherein the first SIPOS layer and the covering second insulating layer overlie at least portions of the gate polysilicon layer, the first SIPOS layer being thereby separated from the semiconductor substrate;
an intermediate third insulating layer, wherein each gate region includes a central area and a peripheral area, and wherein, in the central area, the gate polysilicon layer is in electrical contact with the overlying first SIPOS layer whereas, in the peripheral area, the gate polysilicon layer is electrically separated from the overlying first SIPOS layer by an intermediate third insulating layer; and
an emitter metal layer which overlies the plurality of emitter regions and the gate regions and, at the emitter regions, is in direct contact with the surface of the semiconductor substrate and, at the gate regions, is in direct contact with the second insulating layer.

2. The insulated gate bipolar transistor of claim 1, wherein the termination edge region comprises:
a varied lateral doping region, and wherein a surface of the semiconductor substrate at the varied lateral doping region is in electrical contact with a second SIPOS layer, the second SIPOS layer being covered by the second insulating layer.

3. The insulated gate bipolar transistor of claim 1, wherein the second insulating layer has a thickness of between 0.05 μm and 0.3 μm.

4. The insulated gate bipolar transistor of claim 1, wherein the second insulating layer comprises:
a silicon nitride layer.

5. The insulated gate bipolar transistor of claim 1, wherein the third insulating layer has a thickness of between 0.2 μm and 1.5 μm.

6. The insulated gate bipolar transistor of claim 1, wherein the third insulating layer comprises:
a phosphorous silica glass.

7. The insulated gate bipolar transistor of claim 1, wherein the central area in which the gate polysilicon layer is in electrical contact with the overlying first SIPOS layer is larger than the peripheral area in which the gate polysilicon layer is electrically separated from the overlying first SIPOS layer by the intermediate third insulating layer.

8. The insulated gate bipolar transistor of claim 1, wherein the peripheral area in which the gate polysilicon layer is electrically separated from the overlying first SIPOS layer by the intermediate third insulating layer has a width smaller than 1 μm.

9. The insulated gate bipolar transistor of claim 1, wherein the emitter metal layer has an emitter metal area in a plane parallel an emitter side of the semiconductor substrate and the first SIPOS layer is in contact to the gate polysilicon layer in a contact area, which is at least 50% of the emitter metal area.

10. The insulated gate bipolar transistor of claim 1, wherein the gate polysilicon layer is formed as a trench gate electrode in a recess of the semiconductor substrate, wherein the gate polysilicon layer extends to a region on the surface of the semiconductor substrate laterally from the recess.

11. The insulated gate bipolar transistor of claim 1, wherein the first SIPOS layer is electrically insulated from the emitter metal layer by the second insulating layer.

12. The insulated gate bipolar transistor of claim 1, wherein the emitter metal layer has an emitter metal area in a plane parallel an emitter side of the semiconductor substrate and the first SIPOS layer is in contact to the gate polysilicon layer in a contact area, which is at least 65% of the emitter metal area.

13. The insulated gate bipolar transistor of claim 2, wherein the second insulating layer has a thickness of between 0.05 µm and 0.3 µm.

14. The insulated gate bipolar transistor of claim 13, wherein the second insulating layer comprises:
a silicon nitride layer.

15. The insulated gate bipolar transistor of claim 2, wherein the third insulating layer has a thickness of between 0.2 µm and 1.5 µm.

16. The insulated gate bipolar transistor of claim 5, wherein the third insulating layer comprises:
a phosphorous silica glass.

17. The insulated gate bipolar transistor of claim 2, wherein the central area in which the gate polysilicon layer is in electrical contact with the overlying first SIPOS layer is larger than the peripheral area in which the gate polysilicon layer is electrically separated from the overlying first SIPOS layer by the intermediate third insulating layer.

18. The insulated gate bipolar transistor of claim 7, wherein the peripheral area in which the gate polysilicon layer is electrically separated from the overlying first SIPOS layer by the intermediate third insulating layer has a width smaller than 1 µm.

19. The insulated gate bipolar transistor of claim 2, wherein the emitter metal layer has an emitter metal area in a plane parallel an emitter side of the semiconductor substrate and the first SIPOS layer is in contact to the gate polysilicon layer in a contact area, which is at least 50% of the emitter metal area.

20. The insulated gate bipolar transistor of claim 2, wherein the first SIPOS layer is electrically insulated from the emitter metal layer by the second insulating layer.

\* \* \* \* \*